US012584224B2

(12) United States Patent
Williams et al.

(10) Patent No.: US 12,584,224 B2
(45) Date of Patent: Mar. 24, 2026

(54) COATING APPARATUS

(71) Applicant: PILKINGTON GROUP LIMITED,
Lathom (GB)

(72) Inventors: Ian Ross Williams, Parbold (GB);
Deborah Raisbeck, Burscough (GB);
Douglas Martin Nelson, Curtice, OH
(US); Kevin David Sanderson,
Maumee, OH (US)

(73) Assignee: Pilkington Group Limited, Lathom
(GB)

( * ) Notice: Subject to any disclaimer, the term of this
patent is extended or adjusted under 35
U.S.C. 154(b) by 0 days.

(21) Appl. No.: 18/101,749

(22) Filed: Jan. 26, 2023

(65) Prior Publication Data

US 2023/0167556 A1      Jun. 1, 2023

Related U.S. Application Data

(63) Continuation of application No. 15/748,206, filed as
application No. PCT/GB2016/052359 on Jul. 29,
2016, now abandoned.

(30) Foreign Application Priority Data

Jul. 29, 2015     (GB) ...................................... 1513339

(51) Int. Cl.
| | |
|---|---|
| *C23C 16/54* | (2006.01) |
| *C03C 17/00* | (2006.01) |
| *C03C 17/245* | (2006.01) |
| *C23C 16/40* | (2006.01) |

(52) U.S. Cl.
CPC ............ *C23C 16/54* (2013.01); *C03C 17/005*
(2013.01); *C03C 17/245* (2013.01); *C03C
17/2456* (2013.01); *C03C 2217/212* (2013.01);

*C03C 2217/213* (2013.01); *C03C 2218/152*
(2013.01); *C23C 16/402* (2013.01); *C23C
16/405* (2013.01)

(58) Field of Classification Search
CPC ..... C23C 16/54; C23C 16/402; C23C 16/405;
C23C 16/4557; C23C 16/45563; C03C
17/245; C03C 17/2456; C03C 17/005;
C03C 2217/212; C03C 2217/213; C03C
2218/152
See application file for complete search history.

(56) References Cited

U.S. PATENT DOCUMENTS

| | | | | | |
|---|---|---|---|---|---|
| 2,222,327 | A | * | 11/1940 | Samuel | ................. D06F 75/246 |
| | | | | | 219/245 |
| 2,314,812 | A | * | 3/1943 | Blau | ....................... C03B 11/02 |
| | | | | | 65/68 |
| 3,658,304 | A | * | 4/1972 | Hall, Jr. | ................ C03C 17/245 |
| | | | | | 261/153 |

(Continued)

FOREIGN PATENT DOCUMENTS

| | | |
|---|---|---|
| CN | 104451601 A | 3/2015 |
| EP | 0519597 A1 | 12/1992 |

(Continued)

*Primary Examiner* — Jeffrie R Lund
(74) *Attorney, Agent, or Firm* — Marshall & Melhorn,
LLC

(57) ABSTRACT

An apparatus is provided for coating deposition, particularly
by chemical vapour deposition, on three-dimensional glass
articles such as bottles. The apparatus lends itself to incor-
poration in a plant for a continuous production process for
glass containers.

15 Claims, 5 Drawing Sheets

(56)　　　　References Cited

U.S. PATENT DOCUMENTS

| | | | | |
|---|---|---|---|---|
| 3,736,728 | A * | 6/1973 | Kleissler, Jr. | B01D 46/48 |
| | | | | 55/429 |
| 3,934,063 | A * | 1/1976 | Dubble | C03C 17/005 |
| | | | | 118/721 |
| 3,989,004 | A * | 11/1976 | Scholes | C03C 17/005 |
| | | | | 118/732 |
| 4,150,964 | A * | 4/1979 | Hofmann | B05B 13/00 |
| | | | | 118/724 |
| 4,349,370 | A | 9/1982 | Terneu | |
| 4,389,234 | A * | 6/1983 | Lindner | B05B 16/60 |
| | | | | 118/314 |
| 4,425,868 | A * | 1/1984 | Shapiro | B05B 16/95 |
| | | | | 118/316 |
| 4,431,692 | A * | 2/1984 | Hofmann | C03C 17/005 |
| | | | | 65/60.2 |
| 4,529,627 | A | 7/1985 | Zuerbig | |
| 4,615,916 | A * | 10/1986 | Henderson | C23C 16/40 |
| | | | | 65/60.5 |
| 4,668,268 | A * | 5/1987 | Lindner | C03C 17/005 |
| | | | | 65/60.2 |
| 4,689,749 | A * | 8/1987 | Glogowski | B60S 3/06 |
| | | | | 15/316.1 |
| 4,878,934 | A * | 11/1989 | Thomas | C03C 17/23 |
| | | | | 427/166 |
| 4,879,970 | A * | 11/1989 | Barkalow | C23C 16/453 |
| | | | | 118/314 |
| 5,119,761 | A * | 6/1992 | Nakata | F27B 17/0016 |
| | | | | 118/724 |
| 5,454,873 | A * | 10/1995 | Scholes | C03C 17/005 |
| | | | | 118/729 |
| 5,498,758 | A * | 3/1996 | Scholes | C03C 17/42 |
| | | | | 427/255.6 |
| 5,584,903 | A | 12/1996 | Gutherie et al. | |
| 5,964,947 | A * | 10/1999 | Zhao | C23C 16/45508 |
| | | | | 118/725 |
| 6,189,482 | B1 * | 2/2001 | Zhao | H01J 37/3244 |
| | | | | 118/724 |
| 6,776,292 | B1 * | 8/2004 | Nenno | B03D 1/1456 |
| | | | | 209/168 |
| 7,217,336 | B2 * | 5/2007 | Strang | H01L 21/31116 |
| | | | | 700/121 |
| 7,846,292 | B2 * | 12/2010 | Han | H01J 37/3244 |
| | | | | 156/345.33 |
| 8,877,000 | B2 * | 11/2014 | Strang | C23C 16/455 |
| | | | | 216/37 |
| 8,882,913 | B2 * | 11/2014 | Byun | C23C 16/45572 |
| | | | | 118/724 |
| 9,683,745 | B2 * | 6/2017 | Lehet | F23B 60/02 |
| 10,927,037 | B2 * | 2/2021 | Sanderson | C23C 16/407 |
| 2002/0017243 | A1 * | 2/2002 | Pyo | C23C 16/45574 |
| | | | | 118/715 |
| 2002/0136909 | A1 | 9/2002 | Yang | |
| 2003/0054099 | A1 * | 3/2003 | Jurgensen | C23C 16/4557 |
| | | | | 118/726 |
| 2004/0163761 | A1 * | 8/2004 | Strang | H01J 37/3244 |
| | | | | 257/E21.252 |
| 2006/0269671 | A1 * | 11/2006 | Kim | C23C 16/45565 |
| | | | | 118/715 |
| 2007/0148349 | A1 * | 6/2007 | Fukada | H01L 21/31691 |
| | | | | 438/584 |
| 2009/0169744 | A1 * | 7/2009 | Byun | C23C 16/45578 |
| | | | | 118/724 |
| 2011/0283943 | A1 * | 11/2011 | Pei | C23C 16/4584 |
| | | | | 118/728 |
| 2013/0330930 | A1 * | 12/2013 | Saido | H01L 21/02381 |
| | | | | 438/758 |
| 2014/0261185 | A1 * | 9/2014 | Aboagye | C23C 16/45504 |
| | | | | 118/728 |
| 2014/0290573 | A1 * | 10/2014 | Okabe | C23C 16/4584 |
| | | | | 118/500 |
| 2015/0108078 | A1 * | 4/2015 | Hoekman | B05B 13/0221 |
| | | | | 427/236 |
| 2015/0280051 | A1 * | 10/2015 | Xu | C23C 16/45565 |
| | | | | 438/98 |
| 2016/0237565 | A1 * | 8/2016 | Sieber | C23C 16/45544 |
| 2016/0319429 | A1 * | 11/2016 | Sanderson | C23C 16/45563 |
| 2017/0159168 | A1 * | 6/2017 | Kim | C23C 14/542 |
| 2017/0314134 | A1 * | 11/2017 | Franken | B01J 3/02 |
| 2018/0135203 | A1 * | 5/2018 | Suzuki | C30B 25/14 |
| 2018/0216231 | A1 * | 8/2018 | Williams | C23C 16/54 |
| 2018/0291506 | A1 * | 10/2018 | Sanderson | C03C 17/005 |
| 2018/0362394 | A1 * | 12/2018 | Sanderson | C23C 16/402 |
| 2020/0025369 | A1 * | 1/2020 | O'Donnell | F23L 3/00 |
| 2023/0167556 | A1 * | 6/2023 | Williams | C03C 17/005 |
| | | | | 118/715 |

FOREIGN PATENT DOCUMENTS

| | | | |
|---|---|---|---|
| EP | 2799405 A | | 4/2013 |
| GB | 411075 A | * | 5/1934 |
| GB | 2119360 A | | 4/1982 |
| JP | 2007308789 A | | 11/2007 |
| JP | 2010093067 A | | 4/2010 |
| JP | 2012006784 A | | 1/2012 |
| WO | 02066389 A1 | | 8/2002 |
| WO | 2006009872 A1 | | 1/2006 |
| WO | 2015075434 A1 | | 5/2015 |

* cited by examiner

COATING APPARATUS

BACKGROUND OF THE INVENTION

The invention is concerned with methods and apparatus for deposition of coatings on glass articles, particularly glass vessels such as bottles and jars, during a continuous manufacturing process.

There are numerous situations, where it is desirable or convenient to deposit coatings on glass vessels. For example, during manufacture of glass bottles, a coating of tin oxide is frequently applied to the bottle at the so-called 'hot end' of the process i.e. when recently cast bottle still retains a significant amount of heat. This coating serves a number of purposes.

The coating reduces the degree of 'scuffing' (i.e. visible surface damage having an adverse aesthetic effect) during subsequent process steps. The coating also provides good adhesion for a subsequent polymer coating that is deposited at the 'cold end' of the process for additional lubrication. The coating also improves the strength of the bottle.

A number of approaches have been adopted in the past, to the task of depositing coatings on glass articles.

WO2006/009872 describes deposition by direct injection Chemical Vapour Deposition (CVD) wherein CVD precursors are dissolved in a solvent comprising an ionic liquid which is then injected into a packed vaporiser having a counter current carrier gas flow. The carrier gas strips the precursors from the solvent and transports them in the vapour phase to a deposition chamber where the coating is formed by conventional CVD methods.

More recently, WO2013/163 005 describes a coating apparatus in which a compound to be deposited (a metal oxide) is injected into an air stream which is directed over the article to be coated.

The deposition of coatings on flat glass by CVD methods is well known. Conveniently this is done during the float glass manufacturing process where residual heat from said process assists in the reaction of precursors, which are brought to the surface of the hot glass ribbon that is produced during the float glass process. CVD done on float glass in this way is done at atmospheric pressure—APCVD.

The precursors may be brought to their reaction site separately, i.e. each precursor is brought to the surface of the glass via its own dedicated conduit, only to mix with other precursors on reaching the vicinity of the glass surface but there are certain advantages to 'pre-mixing' systems (in terms of the relative simplicity of the apparatus) in which the precursors are mixed before delivery to the reaction site.

A number of coating apparatuses exist for articles such as bottles, which comprise a coating tunnel having side walls and a top, the tunnel being conveniently located on a conveyor belt which transports the bottles through the tunnel.

The sidewalls of the tunnel include apertures, typically slots or nozzles through which coating materials are delivered, typically in a carrier gas. Exhaust apertures are also typically included.

As the bottles are transported through the tunnel they pass the slots and coating materials are delivered to the surface of the bottle.

In some instances, manufacturers choose to avoid coating of a particular region of an article. For example, where a coating is applied to bottles for beer or carbonated drinks, manufacturers may choose to avoid coating of the lip of the bottle as some coatings may provide a surface roughness or nucleation points which cause unwanted effervescence as the liquid is poured.

EP0519597 describes glass coating apparatus and methods of the type referred to above. In this case a non-turbulent air supply is directed downwards across the coating material stream in order to prevent coating in the top region (particularly the lip) of the bottle.

WO02066389 describes a bottle coating apparatus comprising a coating tunnel in which slots are provided for supplying and exhausting coating materials in gas mixture. In this case, the slots are horizontal and spaced apart so that only strips of the bottle, corresponding to the areas which contact their neighbours during processing, are coated.

This patent also describes dual coating of the bottles by applying a first coating (e.g. tin oxide) whose deposition is assisted by residual heat in the bottles after casting from the molten state (a so called 'hot end' coating) and a second coating (e.g. a polymer spray coating) which is applied at a point in the production process where the bottles have significantly cooled (a 'cold end' coating).

One problem which arises in continuous process coaters of the type described above, is that the arrangement of inlet apertures and flow paths gives rise to a high degree of vorticity and shear in the carrier gas streams. This in turn gives rise to uneven coating as the unstable jets sometimes briefly flick over articles such as bottles while at other times remain directed at one area.

Moreover, for three-dimensional object such as a bottle, the distance from the object to the coating slots (and exhaust vents) is not constant along the height of the object. For example, the body surface of a bottle is closer to the slot than the surface of the narrower neck. This gives rise to uneven coatings when produced by apparatus such as WO02066389.

Lastly, this type of apparatus allows ambient air to enter the tunnel via the ends and this air contains a certain level of contaminants such as moisture which can affect the coating process. Moisture may also be introduced to the interior of the tunnel via a finishing gas stream used to purge the top region of the bottles as described previously.

While these prior art coating apparatuses serve many purposes, where uniformity, surface texture etc. of coatings may not be crucial, new applications for coatings are frequently emerging which require greater control over thickness, uniformity surface texture and other qualities.

Applicant's co-pending application PCT/GB2014/053406 describes a coating apparatus which addresses many of the issues highlighted above. There remains, however, a desire for coating apparatuses which are further improved in terms of efficiency, wasted reactants and coating quality.

SUMMARY OF THE INVENTION

According to the invention, apparatus for coating three dimensional glass articles comprises: a tunnel, having a top and first and second sidewalls, suitable for arranging on a conveyor belt such that the conveyor belt transports the articles from an upstream end, at which articles enter the tunnel, to a downstream end, at which articles exit the tunnel, characterized by: a linear array of nozzles, arranged on at least one side wall to deliver a jet of gas, which jet traverses the path of articles conveyed through the tunnel; at least one exhaust aperture arranged on a sidewall, the exhaust aperture being located closer to the downstream end than the linear array of nozzles and means for applying a negative pressure to the exhaust aperture.

A preferred embodiment comprises a pair of arrays of inlet nozzles arranged with one array on each sidewall, substantially opposite each other in the tunnel. A more preferred embodiment comprises a pair of exhaust apertures, arranged with one aperture on each sidewall, substantially opposite each other in the tunnel.

Preferably, the distance between the pair of arrays of inlet nozzles and the pair of exhaust apertures is between 500 and 1000 mm.

A further preferred embodiment comprises a damper plate, moveable to vary the effective size of an exhaust aperture.

A further preferred embodiment comprises at least one reflective plate, arranged to direct heat radiating from the glass articles on to a linear array of nozzles.

In another preferred embodiment, the exhaust apertures are defined by a substantially vertical conduit comprising walls and a baffle plate extending from the tunnel and away from the downstream end to a wall of the conduit.

In another preferred embodiment, the cross-sectional area of the tunnel is between 1.5 and 2.5 times greater than the cross-sectional area of an exhaust aperture.

In another preferred embodiment, the kinetic energy density ratio of air flowing through the tunnel is between 0.1 and 3 times greater than the kinetic energy density ratio of gas exiting a nozzle.

In another preferred embodiment, at least one array of nozzles is arranged such that the velocity of gases exiting the nozzles includes a component that is substantially parallel with the general direction of articles conveyed through the tunnel.

Another preferred embodiment comprises at least one array of nozzles located at a first distance from the ends of the tunnel and at least one array of nozzles located at a second distance from the ends of the tunnel.

Another preferred embodiment comprises means for heating at least one array of nozzles. The means for heating at least one array of nozzles may comprise an enclosure in which the array is located, and means for heating the interior of the enclosure. The means for heating the interior of the enclosure may comprise an electrical heating element.

BRIEF DESCRIPTION OF THE DRAWINGS

The invention will now be described, by non-limiting example, with reference to the appended figures in which.

DETAILED DESCRIPTION OF THE INVENTION

Figures 1A, 1B, 1C, 1D:
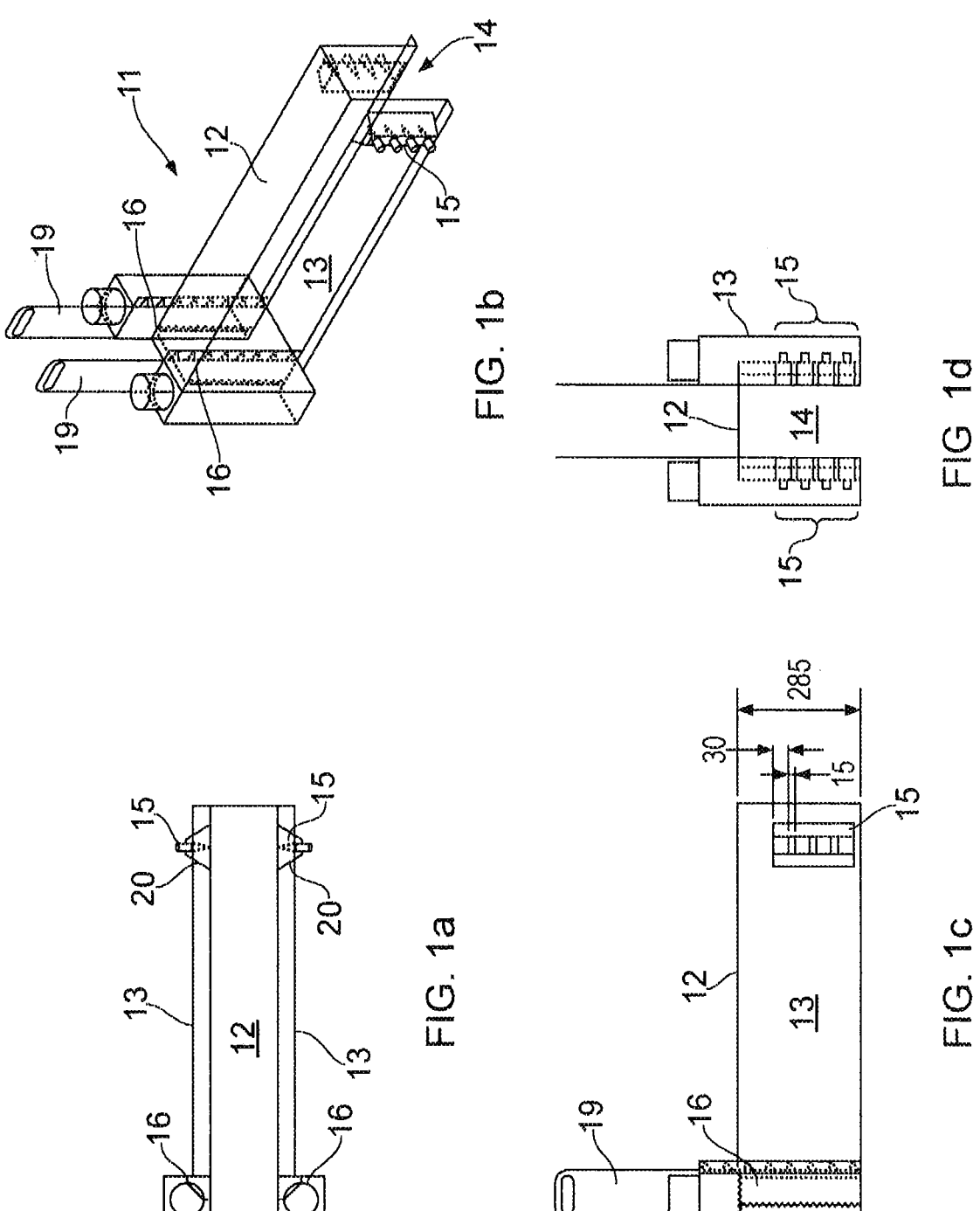
FIGS. 1a-1d and 2 illustrate a first preferred embodiment of the invention.

Referring to FIGS. 1a-1d, apparatus for coating glass articles according to the invention comprises a hood 11 having a top 12 and sidewalls 13 defining a tunnel 14 through which articles to be coated are conveyed by a conveyor belt (not shown).

At least one pair of linear arrays of inlet nozzles 15 is provided, one array 15 from the pair being located on each sidewall 13. Preferably each of the pair are located at substantially the same distance along the path of the articles (i.e. they are located substantially opposite each other). (N.B. while a pair of nozzle arrays is illustrated in this embodiment, a single array is adequate for some chemistries).

Further along the path of the articles, at least one pair of exhaust apertures 16 is provided, again one from the pair on each sidewall 13 and preferably substantially opposite each other.

During operation, chemical precursors of the coating to be deposited are directed to the interior of the tunnel via inlet nozzles 15 and travel along the tunnel in substantially the same direction (23 of FIGS. 2 and 4) of the glass articles. This arrangement of inlet nozzles 15 and exhaust apertures 16 provides for a more effective exposure of the articles to CVD reactants during transit through the hood. Exposure is enhanced as the gaseous CVD reactants and bottles travel in the same direction through the tunnel. The minimum recommended distance between inlet nozzles 15 and exhaust apertures 16 varies according to the particular chemistry being practiced and ranges from 500 mm to 1000 mm.

The effective length of exhaust apertures 16 may be varied by adjusting the height of damper 19. Damper 19 comprises a plate arranged to block a part of the slot forming the exhaust apertures.

CVD reactants may be delivered to the nozzles 15 via heated delivery lines (not shown) in order to prevent condensation of vapour before it enters the hood. In some circumstances, formation of liquid can occur at the nozzles and the hood described here includes reflective plates 20, arranged to direct thermal radiation from the articles on to the nozzles in order to provide heating thereof.

Figure 2:
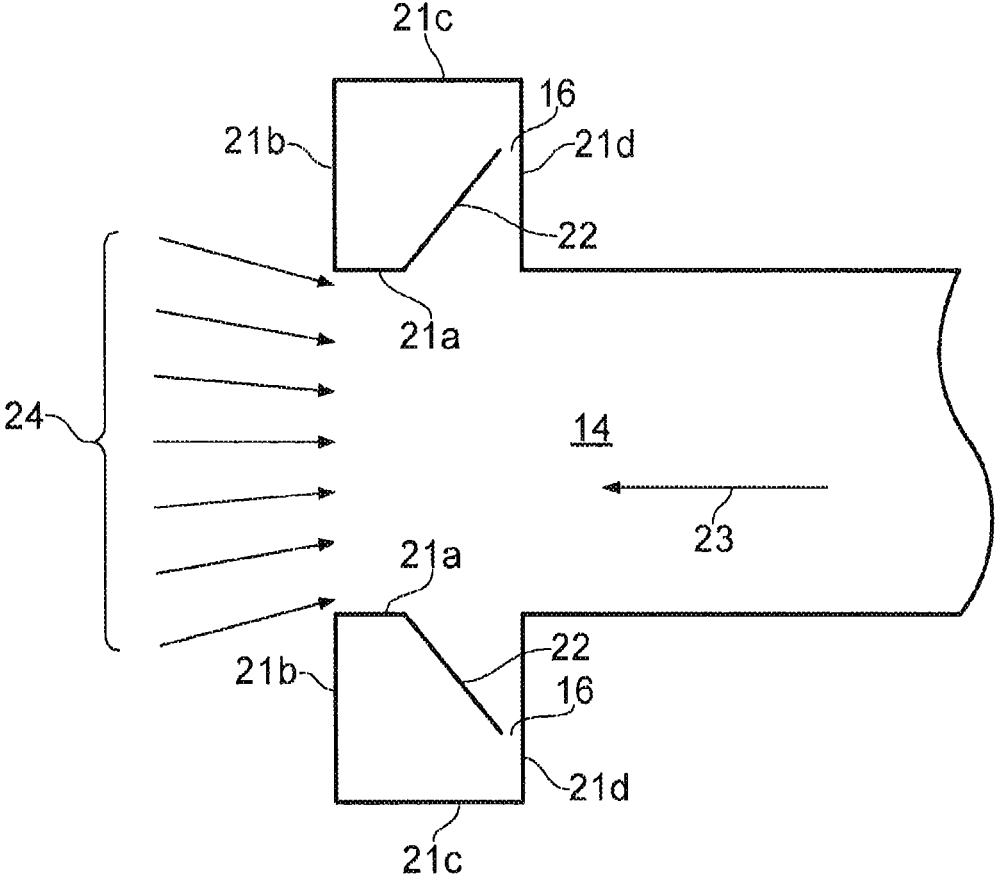

Referring to FIG. 2, the exhaust arrangement is shown in plan view. Walls 21a-21d define substantially box-section conduits with baffle plate 22 defining a slot type aperture 16 with wall 21d. Walls 21a are coincident with the interior of the tunnel and walls 21d are furthest upstream, having regard to the general direction 23 of gases and articles passing through the tunnel. Thus, baffle plates 22 are arranged to extend from the interior of the tunnel to define a slot 16 between baffle plate 22 and the wall 21d which is furthest upstream. A negative pressure is applied to the top of the conduit by an extractor fan (not shown).

The inventors have found this arrangement especially effective in drawing exhaust gases from the hood. This arrangement not only draws exhaust gases and any excess reactant but ambient air is also drawn from the exit of tunnel as illustrated by arrows 24. This air, entering the tunnel in the direction of arrows 24 provides a barrier to exhaust gases or excess reactants that might otherwise leak from the apparatus to the surroundings.

The total area of the slot 16 should be small, compared with the cross-sectional area of the conduit defined by walls 21a-21d and 22 to ensure uniform flow. However the smaller the area, the greater the suction that must be applied to the conduit for effective extraction and the final design choice represents a compromise between these two conflicting factors. A tunnel cross-sectional area to slot area ratio of between 1.5 and 2.5 is found to serve well (an area ratio of 1.6 represents about 10% variation in flow velocity when comparing the flow velocity at the top of the slot and the bottom).

The linear velocity of the CVD reactants exiting the nozzles 15 is an important factor in the achievement of effective coatings.

The articles enter the coating hood with a known velocity (typically 0.3 m/s to 1.5 m/s, or ~90 to 700 articles per minute). The motion of the articles drag a flow of gas through the coater in a fashion similar to the action of a train moving through a tunnel. This gas flow is also driven by suction from the two exhaust apertures 16. To gain a uniform coating on the articles, a jet of coating precursor is preferably blown into the flow path, in one embodiment, perpendicular to the direction of the articles 23 during transit through the hood. The jet must have sufficient momentum so that a concentrated plume of coating gases is directed onto the centre line of the articles' motion. The process becomes inefficient if the highly concentrated plume of coating gases is instead directed to either wall 13 of the coating hood 11.

The choice of jet velocity is optimally identified by fluid flow modelling, but an approximate measure can be found by considering a fluid "kinetic energy ratio". The flow of gases moving along the coating hood has a kinetic energy density given by approximately $K_{air}$=density-of-air×width-of-coater×bottle-velocity$^2$ [units J/m$^2$]. The injected jets of coating precursor have a kinetic energy of approximately $K_{jet}$=density-of-coating-precursor×width-of-nozzle×jet-velocity$^2$ [unit J/m$^2$].

A kinetic energy density ratio $R=K_{air}/K_{jet}$ with R=0.5 is preferred, but good coatings have been seen for 0.1<R<3. If the inlet jet is faster than given by this ratio, i.e. the ratio R is too small, then the jet tends to pass through the path of the containers and is wasted on the opposing coating hood walls. If the inlet jet is slower than given by this ratio, the jet is not thrown far enough and the precursor is wasted on the wall adjoining the inlet nozzle. Similarly, if the coater hood must be made wider, then the jet velocity must increase to throw the jet far enough and so the jet velocity would be increased to maintain the target kinetic-energy ratio.

From this starting point, the velocity of the inlet jet is tuned during coating trials to give the thickest and most evenly distributed coating possible for the given chemistry and bottle velocity. For one particular coater dimensions and bottle velocity, an inlet jet of 8 m/s was found to be adequate with 0.5 m/s conveyor speed.

In the application used to generate the data below, the coating chamber was 165 mm wide, 285 mm tall and 1000 mm long. The coating chamber dimensions are chosen to give just enough room for the glass article to move through without causing crashes at the entrance. If the chamber is too small, then misalignment of glass containers on the conveyor can cause them to collide with the entrance to the coating hood.

A mask (not shown) is fitted to the entrance to the coating hood of approximately the same shape as the outline of the glass articles. This mask restricts the air drawn into the coating hood by the bottles and so gives a higher concentration of coating precursor inside the reaction chamber. The mask is designed to block as much air entering the start of the hood as possible without causing crashes of the glass containers on the conveyor.

The inlet nozzles are positioned at least 100 mm downstream of the entrance and preferably 300 mm. If the nozzles are close to the entrance, then coating gases escape from the entrance to the hood due to occasional backward travelling eddies in the coating plume. The length of the coating hood is chosen so that the chemical reaction has had sufficient time and distance to complete.

For coating of glass bottles, in one embodiment, the inlet nozzle height is chosen so that coating gases are directed at the heel and shoulder of the glass container only, a total of 180 mm height in one example application. Experience teaches that a flow rate of vaporized precursor with carrier gas of 100 standard litres per minute (slm) is commercially viable. From this inlet flow rate, and using the target inlet jet velocity and total coating height the inlet nozzles width was calculated as 1 mm wide. Thinner nozzles are not desirable as they become increasingly prone to blockage. Wider nozzles require more carrier gases to be used to achieve the require inlet velocity and this leads to dilution of the coating precursors and so reduced coating efficiency. If more coating precursor flow can be afforded, then a wider nozzle would be chosen to maintain the target inlet velocity.

A pair of opposing vertical inlet nozzles are used in one embodiment as this helps to position the coating plume at the centre line of the coating hood. Using a nozzle on only one side of the hood may give a good enough coating uniformity for some applications.

The two exhaust ports at the end of the coating hood are specified to just prevent leakage from the end of the coater. The negative pressure on the exhaust slots is determined by fluid simulations. In the present case, the exhaust port has a 12 mm wide flow restriction which runs the full height of the exhaust port (285 mm). At least 100 Pa of suction behind the 12 mm flow restriction was found necessary to prevent gas leakage from the ends of the hood.

Care must be taken to ensure air cannot be drawn into the coating hood from underneath the conveyor belt. An adequate seal needs to be made between the edges of the conveyor belt and the coating hood.

The coater described in FIGS. 1a-1d, 2 was used to produce a series of bottles having a silica and titanium dioxide (titania) coatings.

Titanium (IV) isopropoxide (TTIP) served as the titanium source and Di-t-butoxydiacetoxysilane (DBDAS) served for silicon. These were delivered to the coating hood via an evaporator of the type known in the art. Essentially this comprises a heated metal tube within which the reactant is dropped into a stream of carrier gas.

Silica coatings were successfully deposited using the following parameter ranges:

DBDAS delivery rate: 15-20 cc/min
Evaporator temperature: 200° C.
Evaporator carrier gas: nitrogen, 25 slm
Diluent gas (added to carrier gas stream): nitrogen, 40 slm.
Extraction pressure (applied to exhaust apertures 16) −100 Pa Titania coatings were successfully deposited using the following parameter ranges:

TTIP delivery rate: 15-32 cc/min
Evaporator temperature: 165-200° C.
Evaporator carrier gas: nitrogen, 25 and 30 slm
Diluent gas (added to carrier gas stream): nitrogen, 40 and 70 slm.
Extraction pressure −100 Pa Two sample bottles were selected for coating measurement. These were coated using:

TTIP delivery rate: 35 cc/min
Evaporator temperature: 180° C.
Evaporator carrier gas: nitrogen, 30 slm
Diluent gas (added to carrier gas stream): nitrogen, 70 slm.
Extraction pressure −100 Pa In a glass article coated first with silica and then a UV protection coating such as $TiO_2$ or $Fe_2O_3$, the silica provides protection of the UV protection coating from damage by sodium ions leaching from the glass.

Figure 3:
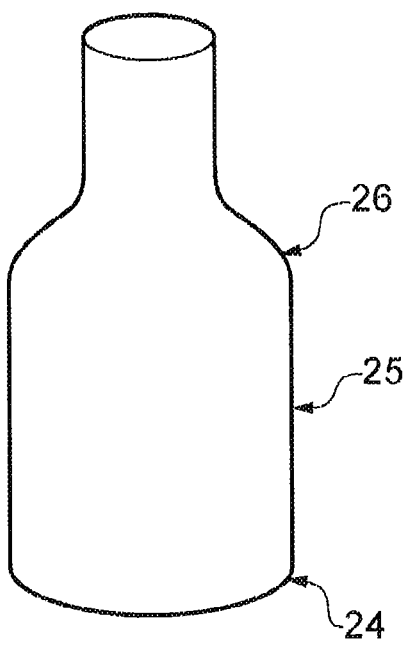
FIG. 3 illustrates locations on bottles, coated according to the invention, where coating thicknesses were measured.

Referring to FIG. 3, coating thicknesses were measured at the heel 24, body 25 and shoulder 26 of the bottles. The measured thicknesses for the two samples are shown in table 3, where the four values for each position (height) represent four measurements taken around the circumference of the bottle.

Thicknesses are given in CTU (coating thickness unit), an optical unit which is well known and frequently used in the glass industry for defining the thickness of coatings. This unit is based on measurements of the reflection of incident light.

TABLE 3

Coating thicknesses measured after on-line deposition of titania on bottles.

| | Sample 1 | | | | Sample 2 | | | |
|---|---|---|---|---|---|---|---|---|
| Heel | 42 | 42 | 32 | 31 | 23 | 24 | 24 | 30 |
| Body | 48 | 44 | 43 | 51 | 52 | 51 | 31 | 41 |
| Shoulder | 39 | 50 | 45 | 58 | 55 | 68 | 44 | 42 |

Figure 4:
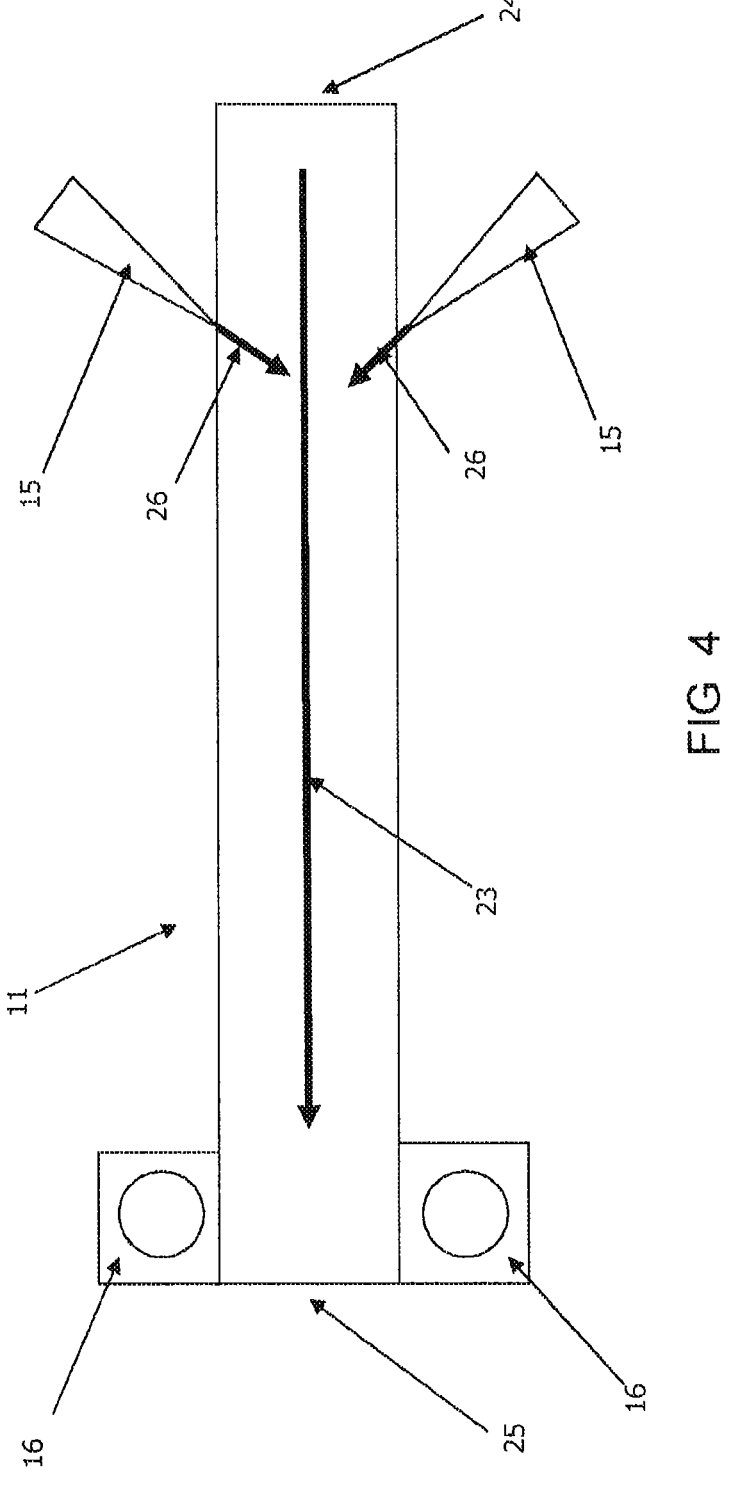
FIG. 4 is a plan view illustrating a second preferred embodiment of the invention and FIG. 5 is a further plan view, illustrating further preferred features of the invention.

Referring to FIG. 4, in an alternative embodiment, the inlet nozzles 15 are arranged non-perpendicular to the general direction 23 of articles and gasses passing through the tunnel 11, such that the velocity of gases (coating precursors and any carrier gas) exiting the nozzles (generally indicated by arrows 26) includes a component that is parallel with the direction 23.

In layman's terms, the nozzles 15 point 'downstream' to some extent. This arrangement reduces the likelihood of reactants or carrier gases being blown upstream upon exiting the nozzles 15 and, in some cases exiting the upstream end of the tunnel. (In this description, the terms 'upstream' and 'downstream' refer to the direction 23 of articles and gasses passing through the tunnel 11. The upstream end 24 of the tunnel is the end where articles enter and the downstream end 25 is the end where articles exit).

Figure 5:
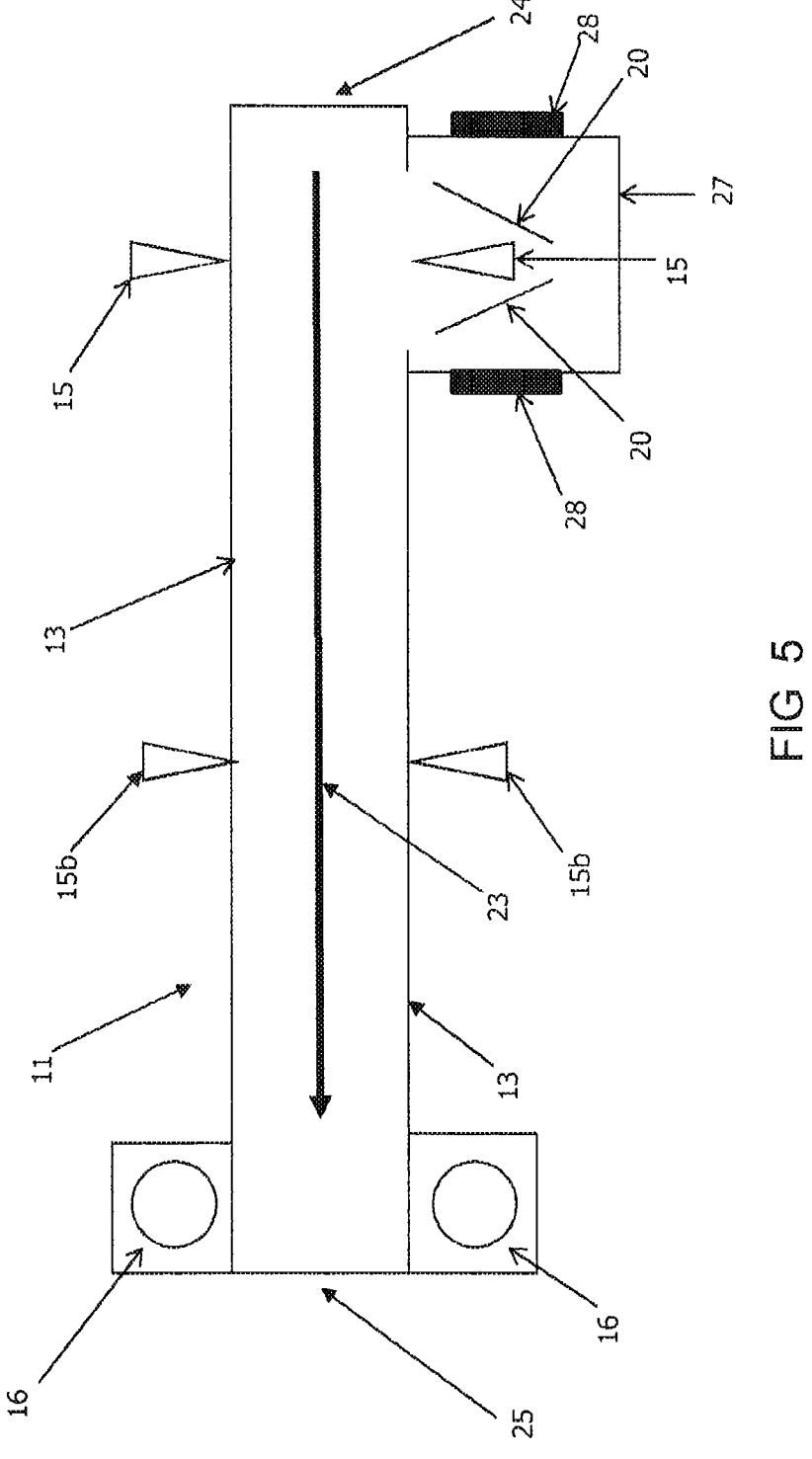

Referring to figure five, a further embodiment of the invention may include a first linear array of nozzles 15 on a sidewall 13 and a further array of nozzles 15b located downstream (i.e. closer to the downstream end) of the first array of nozzles. The further array of nozzles 15b may be located on the same sidewall 13 as the first array of nozzles; it may be located on the opposite sidewall 13 of the first array 15 or, as illustrated in FIG. 5, the nozzles may be arranged in pairs such that each array 15 or 15b of a pair is located on the opposite sidewall of the other array of the pair, at a substantially similar distance from the ends of the tunnel.

Use of at least two arrays of nozzles, located at different distances from the ends of the tunnel allows for two-step deposition of coatings. For example, the same coating precursors may be provided to the nozzles 15 and 15b to provide for a thicker coating of a given material, or different coating precursors may be provided to nozzles 15 and 15b to provide for two (or multiple) layers of different materials.

Apparatus according to the invention may also include means for heating the nozzle array 15. In one embodiment, such means comprises an enclosure 27 in which the nozzle array is located along with heating elements 28 for heating and controlling the internal temperature of the enclosure 27. The temperature of the enclosure should be low enough to prevent pre-reaction of the coating precursors, but high enough to prevent unwanted condensation or other precipitation on the nozzles 15.

Heating elements 28 could comprise electrically powered (resistive) heating element such as are commonly realised as tapes or plates.

The enclosure 27 may open into the tunnel so that heat radiated by the articles to be coated can contribute to the heating of the nozzles 15. As noted previously, reflector plates 20 may serve to enhance this heating effect.

For clarity, the optional heating means 27, 28 and further optional reflectors 20 are only shown for one nozzle array 15 but it will be apparent to the skilled reader that these features could be employed, individually or in combination with any or all nozzle arrays 15 incorporated in apparatus according to the invention.

Moreover, FIG. 5 illustrates certain further preferred features in conjunction with nozzles 15, 15b that are arranged to deliver precursors having a velocity that is substantially perpendicular to the general direction of articles conveyed through the tunnel. However, these features could also be used in conjunction with nozzles 15, 15b, of which at least some are arranged to deliver precursors having a velocity having a component that is substantially parallel to the general direction of articles conveyed through the tunnel.

What is claimed is:

1. An apparatus for coating three dimensional glass vessels comprising:

a tunnel, having a top and first and second sidewalls, suitable for arranging on a conveyor belt such that the conveyor belt transports the vessels from an upstream end, at which vessels enter the tunnel, to a downstream end, at which vessels exit the tunnel;

a linear array of nozzles, arranged on at least one side wall to deliver a jet of gas, which jet traverses the path of vessels conveyed through the tunnel;

at least one exhaust aperture arranged on a sidewall, the exhaust aperture being configured to be in communication with a source of negative pressure, wherein every exhaust aperture arranged on a sidewall is located closer to the downstream end of the tunnel than the linear array of nozzles; and a damper plate, moveable to vary the effective size of the at least one exhaust aperture;

wherein at least one of the linear array of nozzles comprises a tapered portion, wherein a cross-sectional area of the tunnel extends between the first and second sidewalls of the tunnel, the top of the tunnel, and the conveyor belt, and wherein the cross-sectional area of the tunnel is between 1.5 and 2.5 times greater than the cross-sectional area of an exhaust aperture.

2. The apparatus according to claim 1, comprising a pair of arrays of nozzles arranged with one array on each sidewall, substantially opposite each other in the tunnel.

3. The apparatus according to claim 2, comprising a pair of exhaust apertures, arranged with one aperture on each sidewall, substantially opposite each other in the tunnel.

4. The apparatus according to claim 3, wherein the distance between the pair of arrays of nozzles and the pair of exhaust apertures is between 500 and 1000 mm.

5. The apparatus according to claim 1, further comprising at least one reflective plate, arranged to direct heat radiating from the glass vessels on to a linear array of nozzles.

6. The apparatus according to claim 1, wherein the exhaust apertures are defined by a substantially vertical conduit comprising walls and a baffle plate extending from the tunnel and away from the downstream end to a wall of the conduit.

7. The apparatus according to claim 1, wherein the kinetic energy density ratio of air flowing through the tunnel is between 0.1 and 3 times greater than the kinetic energy density ratio of gas exiting a nozzle.

8. The apparatus according to claim 1, wherein at least one array of nozzles is arranged such that the velocity of gases exiting the nozzles includes a component that is substantially parallel with the general direction of vessels conveyed through the tunnel.

9. The apparatus according to claim 1, comprising at least one array of nozzles located at a first distance from the ends of the tunnel and at least one array of nozzles located at a second distance from the ends of the tunnel.

10. The apparatus according to claim 1, further including means for heating at least one array of nozzles.

11. The apparatus according to claim 10, wherein the means for heating at least one array of nozzles comprises an enclosure in which the array is located, and means for heating the interior of the enclosure.

12. The apparatus according to claim 11, wherein the means for heating the interior of the enclosure comprises an electrical heating element.

13. The apparatus of claim 1, wherein each of the linear array of nozzles comprises a tapered portion.

14. The apparatus of claim 1 configured so that a linear velocity of the gas delivered through the linear array of nozzles is driven in part by negative pressure in communication with the at least one exhaust aperture.

15. An apparatus for coating three dimensional glass vessels comprising:

a tunnel, having a top and first and second sidewalls, suitable for arranging on a conveyor belt such that the conveyor belt transports the vessels from an upstream end, at which vessels enter the tunnel, to a downstream end, at which vessels exit the tunnel;

a linear array of nozzles, arranged on at least one side wall to deliver a jet of gas, which jet traverses the path of vessels conveyed through the tunnel; and at least one exhaust aperture arranged on a sidewall, the exhaust aperture being configured to be in communication with a source of negative pressure;

wherein a cross-sectional area of the tunnel extends between the first and second sidewalls of the tunnel, the top of the tunnel, and the conveyor belt, and wherein the cross-sectional area of the tunnel is between 1.5 and 2.5 times greater than the cross-sectional area of an exhaust aperture.

\* \* \* \* \*